US009947597B2

(12) United States Patent
Rastogi et al.

(10) Patent No.: US 9,947,597 B2
(45) Date of Patent: Apr. 17, 2018

(54) DEFECTIVITY METROLOGY DURING DSA PATTERNING

(71) Applicant: Tokyo Electron Limited, Minato-ku, Tokyo (JP)

(72) Inventors: Vinayak Rastogi, Albany, NY (US); Alok Ranjan, Tomiya (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/462,005

(22) Filed: Mar. 17, 2017

(65) Prior Publication Data

US 2017/0287790 A1    Oct. 5, 2017

Related U.S. Application Data

(60) Provisional application No. 62/316,216, filed on Mar. 31, 2016.

(51) Int. Cl.
*H01L 21/66*    (2006.01)
*H01L 21/306*    (2006.01)
(Continued)

(52) U.S. Cl.
CPC ............ *H01L 22/12* (2013.01); *H01L 21/308* (2013.01); *H01L 21/3065* (2013.01);
(Continued)

(58) Field of Classification Search
CPC ..... H01L 22/10; H01L 22/12; H01L 21/3065; H01L 21/308; H01L 21/3081;
(Continued)

(56) References Cited

U.S. PATENT DOCUMENTS 5,344,742 A    9/1994 Sinta et al.
5,650,261 A    7/1997 Winkle
(Continued)

FOREIGN PATENT DOCUMENTS

CN    101578232 A    11/2009
CN    101681812 A    3/2010
(Continued)

OTHER PUBLICATIONS

State Intellectual Property Office of People's Republic of China, English translation of Office Action issued in related CN Application No. 201380031525.5 dated Nov. 13, 2017, 12 pp.
(Continued)

*Primary Examiner* — Thanhha Pham
(74) *Attorney, Agent, or Firm* — Wood Herron & Evans LLP

(57) ABSTRACT

The described embodiments include performing a curing process for selective treatment, or hardening, of PS regions in PS-b-PMMA block copolymer DSA films prior to dry etch development of PMMA regions. In various embodiments, the curing chemistry can be Ar/H2, HBr, N2/H2, etc., which has the capability of generating Vacuum Ultraviolet (VUV) photon flux for polymer curing. The curing effect may enhance the etch resistance of PS regions, thereby freezing the bulk defects during plasma PMMA removal. The defects can then be measured by commonly used metrology techniques like CDSEM and quantized.

20 Claims, 8 Drawing Sheets

(51) Int. Cl.
*H01L 21/308* (2006.01)
*H01L 21/311* (2006.01)
*H01L 21/321* (2006.01)
*H01L 21/3065* (2006.01)
*H01L 21/3213* (2006.01)

(52) U.S. Cl.
CPC ...... *H01L 21/3081* (2013.01); *H01L 21/3086* (2013.01); *H01L 21/31144* (2013.01); *H01L 21/32136* (2013.01); *H01L 21/32139* (2013.01); *H01L 22/10* (2013.01)

(58) Field of Classification Search
CPC ........... H01L 21/3086; H01L 21/31138; H01L 21/31144; H01L 21/32136; H01L 21/32139
See application file for complete search history.

(56) References Cited

U.S. PATENT DOCUMENTS

| | | | |
|---|---|---|---|
| 5,709,754 A | 1/1998 | Morinville et al. |
| 5,830,608 A | 11/1998 | Ishiwata et al. |
| 6,303,477 B1 | 10/2001 | Ianovitch |
| 6,312,971 B1 | 11/2001 | Amundson et al. |
| 6,846,748 B2 | 1/2005 | Chien et al. |
| 6,855,476 B2 | 2/2005 | Ferreira et al. |
| 7,521,094 B1 | 4/2009 | Cheng et al. |
| 7,579,278 B2 | 8/2009 | Sandhu |
| 7,687,220 B2 | 3/2010 | Yamato et al. |
| 7,723,009 B2 | 5/2010 | Sandhu et al. |
| 7,754,518 B2 | 7/2010 | Koelmel et al. |
| 7,811,940 B2 | 10/2010 | Sandhu |
| 7,923,373 B2 | 4/2011 | Sandhu |
| 8,039,196 B2 | 10/2011 | Kim et al. |
| 8,083,953 B2 | 12/2011 | Millward et al. |
| 8,241,822 B2 | 8/2012 | Yamato et al. |
| 8,277,564 B2 | 10/2012 | Le et al. |
| 8,333,522 B2 | 12/2012 | Arima et al. |
| 8,420,304 B2 | 4/2013 | Inatomi |
| 8,603,867 B2 | 12/2013 | Kim et al. |
| 8,790,522 B1 | 7/2014 | Schmid et al. |
| 8,853,085 B1 | 10/2014 | Abdallah et al. |
| 8,900,467 B1 | 12/2014 | Chapuis et al. |
| 8,980,538 B2 | 3/2015 | Somervell et al. |
| 8,986,554 B2 | 3/2015 | Kim et al. |
| 9,005,877 B2 | 4/2015 | Rathsack et al. |
| 9,034,197 B2 | 5/2015 | Lille et al. |
| 9,190,288 B2 | 11/2015 | Tanaka et al. |
| 9,339,312 B2 | 5/2016 | Doherty et al. |
| 9,412,611 B2 | 8/2016 | Somervell et al. |
| 9,418,860 B2 | 8/2016 | Somervell et al. |
| 2002/0192619 A1 | 12/2002 | Besek |
| 2002/0193619 A1 | 12/2002 | Crivello et al. |
| 2003/0004075 A1 | 1/2003 | Suto et al. |
| 2003/0084925 A1 | 5/2003 | Nakajima et al. |
| 2003/0227090 A1 | 12/2003 | Okabe |
| 2005/0056219 A1 | 3/2005 | Dip et al. |
| 2005/0215713 A1 | 9/2005 | Hessell et al. |
| 2005/0229427 A1 | 10/2005 | Sugimoto et al. |
| 2006/0123658 A1 | 6/2006 | Izumi |
| 2006/0251989 A1 | 11/2006 | Breyta et al. |
| 2007/0037412 A1 | 2/2007 | Dip et al. |
| 2007/0155132 A1 | 7/2007 | Ancilotti et al. |
| 2007/0184656 A1 | 8/2007 | Sherman et al. |
| 2007/0224823 A1 | 9/2007 | Sandhu |
| 2007/0237697 A1 | 10/2007 | Clark |
| 2007/0238028 A1 | 10/2007 | Inatomi |
| 2008/0032490 A1 | 2/2008 | Tuominen et al. |
| 2008/0193658 A1 | 8/2008 | Millward |
| 2008/0311402 A1 | 12/2008 | Jung et al. |
| 2008/0318005 A1 | 12/2008 | Millward |
| 2009/0081827 A1 | 3/2009 | Yang et al. |
| 2009/0087664 A1 | 4/2009 | Nealey et al. |
| 2009/0181171 A1 | 7/2009 | Cheng et al. |
| 2009/0200646 A1 | 8/2009 | Millward et al. |
| 2009/0215272 A1 | 8/2009 | Sadjadi et al. |
| 2009/0236309 A1 | 9/2009 | Millward et al. |
| 2009/0291398 A1 | 11/2009 | Horiuchi |
| 2010/0055621 A1 | 3/2010 | Hatakeyama et al. |
| 2010/0159214 A1 | 6/2010 | Hasegawa et al. |
| 2010/0178615 A1 | 7/2010 | Colburn et al. |
| 2010/0193898 A1 | 8/2010 | Hautala et al. |
| 2010/0200774 A1 | 8/2010 | Burke et al. |
| 2010/0227276 A1 | 9/2010 | Mizuno |
| 2010/0279062 A1 | 11/2010 | Millward et al. |
| 2011/0033786 A1 | 2/2011 | Sandhu |
| 2011/0039413 A1 | 2/2011 | Akinmade-Yusuff et al. |
| 2011/0059299 A1 | 3/2011 | Kim et al. |
| 2011/0147965 A1 | 6/2011 | Mistry et al. |
| 2011/0147984 A1 | 6/2011 | Cheng et al. |
| 2011/0147985 A1 | 6/2011 | Cheng et al. |
| 2011/0151382 A1 | 6/2011 | Kim et al. |
| 2011/0186544 A1 | 8/2011 | Endou et al. |
| 2011/0206905 A1 | 8/2011 | Buriak et al. |
| 2011/0229120 A1 | 9/2011 | Takaki et al. |
| 2011/0232677 A1 | 9/2011 | Liu et al. |
| 2011/0272381 A1 | 11/2011 | Millward et al. |
| 2012/0003587 A1 | 1/2012 | Kim et al. |
| 2012/0031892 A1 | 2/2012 | Shigetomi et al. |
| 2012/0046415 A1 | 2/2012 | Millward et al. |
| 2012/0046421 A1 | 2/2012 | Darling et al. |
| 2012/0067843 A1 | 3/2012 | Watanabe et al. |
| 2012/0077127 A1 | 3/2012 | Sills et al. |
| 2012/0088192 A1 | 4/2012 | Trefonas et al. |
| 2012/0141741 A1 | 6/2012 | Millward |
| 2012/0202017 A1 | 8/2012 | Nealey et al. |
| 2012/0207940 A1 | 8/2012 | Muramatsu et al. |
| 2012/0223053 A1 | 9/2012 | Millward et al. |
| 2012/0312501 A1 | 12/2012 | Koole et al. |
| 2013/0099362 A1 | 4/2013 | Kim et al. |
| 2013/0143406 A1 | 6/2013 | Hsu et al. |
| 2013/0183827 A1 | 7/2013 | Millward |
| 2013/0189504 A1 | 7/2013 | Nealey et al. |
| 2013/0273330 A1* | 10/2013 | Wang ............... H01L 21/31144 428/172 |
| 2013/0292805 A1 | 11/2013 | Cai et al. |
| 2013/0344249 A1 | 12/2013 | Minegishi et al. |
| 2014/0061154 A1 | 3/2014 | Kim et al. |
| 2014/0065839 A1 | 3/2014 | Kawanishi et al. |
| 2014/0099583 A1 | 4/2014 | Holmes et al. |
| 2014/0116980 A1 | 5/2014 | Wuister |
| 2014/0127910 A1 | 5/2014 | Hieno et al. |
| 2014/0154630 A1 | 6/2014 | Schmid et al. |
| 2014/0256145 A1 | 9/2014 | Abdallah et al. |
| 2014/0287083 A1 | 9/2014 | Gao et al. |
| 2014/0315390 A1 | 10/2014 | Abdallah et al. |
| 2015/0021295 A1 | 1/2015 | Yoshikawa et al. |
| 2015/0108087 A1 | 4/2015 | Somervell et al. |
| 2015/0111387 A1 | 4/2015 | Somervell et al. |
| 2015/0126034 A1 | 5/2015 | Latypov et al. |
| 2015/0191034 A1 | 7/2015 | Millward et al. |

FOREIGN PATENT DOCUMENTS

| | | |
|---|---|---|
| CN | 102037543 A | 4/2011 |
| CN | 103187245 A | 7/2013 |
| DE | 102012105384 A1 | 9/2012 |
| JP | 11030711 A | 2/1999 |
| JP | 2002163998 A | 6/2002 |
| JP | 2002265617 A | 9/2002 |
| JP | 2007100191 A | 4/2007 |
| JP | 2007279493 A | 10/2007 |
| JP | 2008036491 A | 2/2008 |
| JP | 2010085977 A | 4/2010 |
| JP | 2010527137 A | 8/2010 |
| JP | 2010531051 A | 9/2010 |
| JP | 2011018778 A | 1/2011 |
| JP | 2011515537 A | 5/2011 |
| JP | 2011522707 A | 8/2011 |
| JP | 2012038969 A | 2/2012 |
| JP | 2012064783 A | 3/2012 |
| JP | 2013164436 A | 8/2013 |
| KR | 200900097884 A | 1/2009 |

(56) References Cited

FOREIGN PATENT DOCUMENTS

| | | |
|---|---|---|
| KR | 20120133272 A | 12/2012 |
| WO | 9627212 A1 | 9/1996 |
| WO | 03016209 A1 | 2/2003 |
| WO | 2007127496 A2 | 11/2007 |
| WO | 2008097736 A2 | 8/2008 |
| WO | 2008150673 A1 | 12/2008 |
| WO | 2009100053 A2 | 8/2009 |
| WO | 2009117243 A1 | 9/2009 |
| WO | 2009142869 A2 | 11/2009 |
| WO | 2010042290 A2 | 4/2010 |
| WO | 2011036778 A1 | 3/2011 |
| WO | 20110140200 A1 | 11/2011 |
| WO | 2012071330 A1 | 5/2012 |
| WO | 2012084558 A1 | 6/2012 |
| WO | 2012175343 A1 | 12/2012 |
| WO | 20120175342 A2 | 12/2012 |
| WO | 2013010730 A1 | 1/2013 |

OTHER PUBLICATIONS

Liu et al., "Integration of Block Copolymer Directed Assembly with 193 Immersion Lithography" American Vacuum Society, J. Vac. Sci. Technol. B 28(6), Nov./Dec. 2010, 5 pp.

Bielawski et al., "Regiospecific One-Pot Synthesis of Diaryliodonium Tetrafluoroborates from Arylboronic Acids and Aryl Iodides," J. Org. Chem. 73:4602-4607, 2008.

Cheng, et al., "EUVL Compatible, LER Solutions using Functional Block Copolymers," Alternative Lithographic Technologies IV, Proc. of SPIE, vol. 8323, 2012, 11 pp.

Cupta, "Photoacid Generators for Catalytic Decomposition of Polycarbonate," Thesis for Master of Science, Georgia Institute of Technology, 2006, 137 pp.

Gronheid, R.; Rincon Delgadillo, P.; Nealey, P.; Younkin, T.; Matsunaga, K.; Somervell, M. and Nafus, K. Implementations of self-assembly in a 300mm processing environment. IEEE Litho Workshop. (Jun. 25-28, 2012; Williamsburg, VA, USA).

Maki et al., "Photocleavable Molecule for Laser Desorption Ionization Mass Spectrometry," J. Org. Chem. 72:6427-6433, 2007.

Padmanaban et al., "Application of Photodecomposable Base Concept to 193 nm Resists," Proc. of SPIE. 3999:1136-1146, 2000.

Gotrik et al., "Thermosolvent Annealing of Block Copolymer Thin Films for Directed Self-Assembly Applications," 2012 Materials Research Society (MRS) Fall Meeting & Exhibit, Symposium S: Directed Self-Assembly for Nanopatterning, Nov. 25-30, 2012, Boston, Massachussetts, 15 pp.

Ruebner et al., "A cyclodextrin dimer with a photocleavable linker as a possible carrier for the photosensitizer in photodynamic tumor therapy," PNAS. 96(26):14692-14693, 1999.

Skulski, "Organic Iodine(I, III, and V) Chemistry: 10 Years of Development at the Medical University of Warsaw, Poland," Molecules. 5:1331-1371, 2000.

Weissman et al., "Recent advances in ether dealkylation," Tetrahedron. 61:7833-7863, 2005.

Hammersky et al., "Self-Diffusion of a Polystyrene-Polyisoprene Block Copolymer," Journal of Polymer Science: Part B: Polymer Physics. 34:2899-2909, 1996.

Jung et al., "A Path to Ultranarrow Patterns Using Self-Assembled Lithography," Nano Lett. 10:1000-1005, 2010.

Tavakkoli K.G. et al., "Templating Three-Dimensional Self-Assembled Structures in Bilayer Block Copolymer Films," Science, 336:1294-1298, 2012.

Cushen et al., "Oligosaccharide/Silicon-Containing Block Copolymers with 5 nm Features for Lithographic Applications" ACS Nano, vol. 6, No. 4, 2012, pp. 3424-3433.

Dean, et al., "Orientation Control of Silicon-containing Block Copolymer Films," Dept. of Chemical Engineering, The University of Texas at Austin, 1 p.

Jarnagin, et al., "Investigation of High c Block Copolymers for Directed Self-Assembly: Synthesis and Characterization of PS-b-PHOST," Alternative Lithographic Technologies IV, Proc. of SPIE, vol. 8323, 2012, 9 pp.

Steven J. Lickteig et al., Optimization of an Integrated and Automated Macro Inspection System for the Utilization of Wafer Color Variation Detection in a Photolithography Cluster, Metrology, Inspection, and Process Control for Microlithography, Proc. of SPIE vol. 6152, 9 pages.

Peng et al., "Development of Nanodomain and Fractal Morphologies in Solvent Annealed Block Copolymer Thin Films", Macromolecular Rapid Communications 2007, 28, 1422-1428.

Korean Intellectual Property Office, English translation of Office Action issued in related KR Application No. 10-2016-7013298 dated Sep. 14, 2017, 11 pp.

Korean Intellectual Property Office, Office Action issued in related Korean Patent Application No. 10-2016-7013228 dated Jan. 24, 2018, 6 pp. including English translation.

* cited by examiner

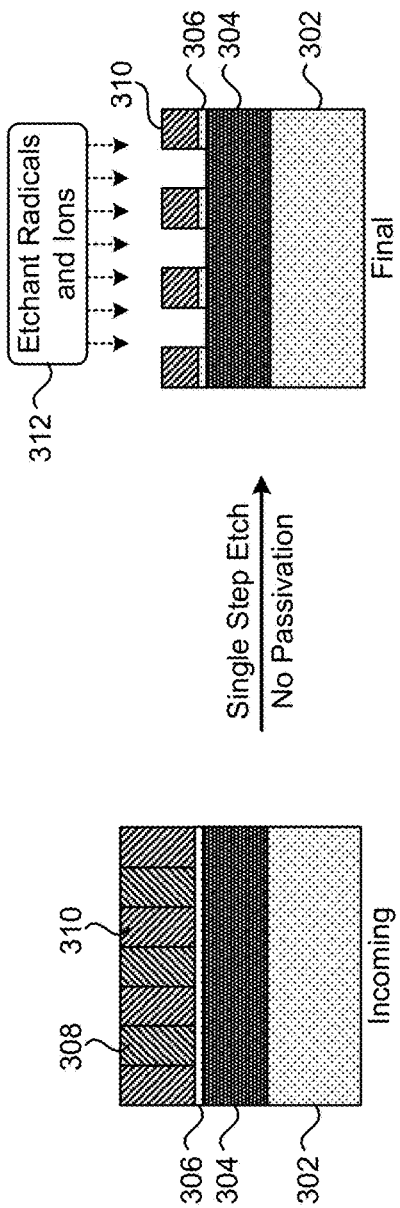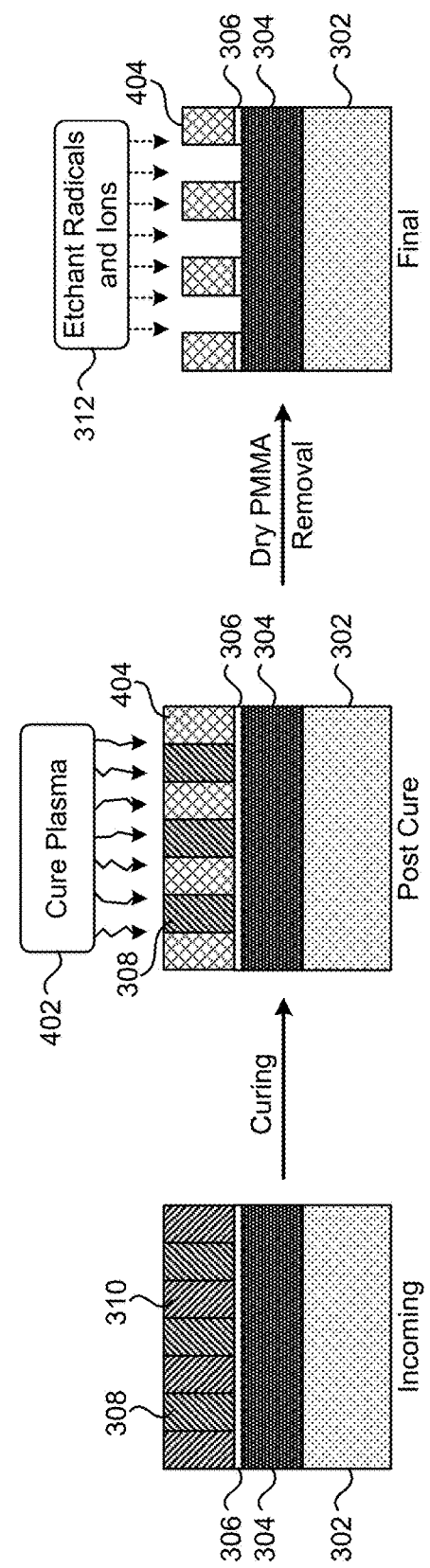
FIG. 3
FIG. 4

DEFECTIVITY METROLOGY DURING DSA PATTERNING

CROSS-REFERENCE TO RELATED APPLICATION

This application is related to and claims priority to U.S. Provisional Application No. 62/316,216, filed Mar. 31, 2016, the entire contents of which are herein incorporated by reference.

BACKGROUND OF THE INVENTION

Field of Invention

The present invention relates to systems and methods for substrate processing, and more particularly to a method and system for defectivity metrology during Directed Self Assembly (DSA) patterning.

Description of Related Art

The need to remain competitive in cost and performance in the production of semiconductor devices has caused a continuous increase in device density of integrated circuits. Higher integration and miniaturization in a semiconductor integrated circuit, requires an associated miniaturization of a circuit pattern formed on a semiconductor wafer.

Photolithography is a standard technique used to manufacture semiconductor integrated circuitry by transferring geometric shapes and patterns on a mask to the surface of a semiconductor wafer. Current state-of-the-art photolithography tools only allow feature sizes down to about 25 nm. Accordingly, new methods are needed to provide smaller features.

Directed Self Assembly (DSA) of integrated circuits has been used to further reduce feature sizes. One type of DSA includes self-assembly of block copolymers (BCPs), which has been considered a potential tool for improving the resolution to better values than those obtainable by prior art lithography methods alone. Block copolymers are useful compounds in nanofabrication, because they may undergo an order-disorder transition on cooling below a certain temperature (order-disorder transition temperature TOD), resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1 nm to 5 nm and may be manipulated by modification of the chemical compositions of the blocks of the copolymer.

A block copolymer may form many different phases upon self-assembly, dependent upon the volume fractions of the blocks, degree of polymerization within each block type (i.e., number of monomers of each respective type within each respective block), the optional use of a solvent and surface interactions. When applied in a thin film, the geometric confinement may present additional boundary conditions, which may limit the number of phases. In general, spherical (e.g., cubic), cylindrical (e.g., tetragonal or hexagonal) and lamellar phases (i.e., self-assembled phases with cubic, hexagonal or lamellar space-filling symmetry) are practically observed in thin films of self-assembled block copolymers, and the phase type observed may depend upon the relative volume fractions of the different polymer blocks. The self-assembled polymer phases may orient with symmetry axes parallel or perpendicular to the substrate and lamellar and cylindrical phases are interesting for lithography applications, because they may form line and spacer patterns and contact hole arrays, respectively, and may provide good contrast when one of the domain types is subsequently etched.

Two methods used to guide DSA of a block copolymer onto a surface are grapho-epitaxy and chemical pre-patterning, also called chemi-epitaxy. In the grapho-epitaxy method, self-organization of a block copolymer is guided by topological pre-patterning of the substrate. A self-aligned block copolymer can form a parallel linear pattern with adjacent lines of the different polymer block domains in the trenches defined by the patterned substrate. For example, if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the patterned substrate by the block copolymer pattern subdividing the spacing of a pre-pattern on the substrate.

Accordingly, to achieve the advantages provided by grapho-epitaxy and chemi-epitaxy of block copolymers, new lithographic patterning and DSA techniques are required, including the ability to integrate such materials in patterning workflows. One example of a block copolymer is polystyrene-b-poly(methyl methacrylate) (PMMA). However, when removing the PMMA portion from the polystyrene-b-poly(methyl methacrylate) (PS-b-PMMA) layer to leave behind a polystyrene (PS) pattern, conventional etching techniques have suffered. Due to the organic nature of both materials, and their similarities, developing an etch chemistry with suitable etch selectivity has been challenging. Furthermore, conventional etch processes produce pattern defectivity, such as line edge roughness/line width roughness (LER/LWR), that are unacceptable as per the semiconductor device performance requirements. In extreme cases, the defectivity of the PS can be catastrophic due to pattern collapse. For these reasons, defect detection methods are needed.

A further challenge lies in detecting defects which are sub-surface and in the bulk of phase separated BCP films. Commonly used metrology methods like Critical Dimension Scanning Electron Microscope (CDSEM) and optical scattering methods cannot detect such defects because of low selectivity etching processes, which tend to mitigate prior to detection.

SUMMARY OF THE INVENTION

Provided is a method for defectivity metrology during DSA patterning. In an embodiment, a method may include providing the substrate in a process chamber of the fabrication system, the substrate comprising a top layer with a first material and a second material and an underlying layer. The method may also include performing a vacuum ultraviolet (VUV) curing process on the substrate to enhance etch resistance of the second material during a subsequent etch process and to enable metrology to detect defects underneath a surface of the top layer. Additionally, the method may include performing a metrology process to quantify defects made visible by the VUV curing process, the metrology process generating a defect profile of the top layer. Further, the method may include performing an etch process to remove the second material using a dry plasma process and utilizing the defect profile, the etch process generating a first pattern on the substrate. Additionally, the method may include controlling one more integration variables in order to meet target integration objectives during one or more process including the VUV curing process, the metrology process, and/or the etch process.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

FIG. 3 illustrates one embodiment of a dry PMMA etch process.

FIG. 4 illustrates another embodiment of a PMMA etch process.

DETAILED DESCRIPTION OF EMBODIMENTS OF THE INVENTION

Figure 1A:
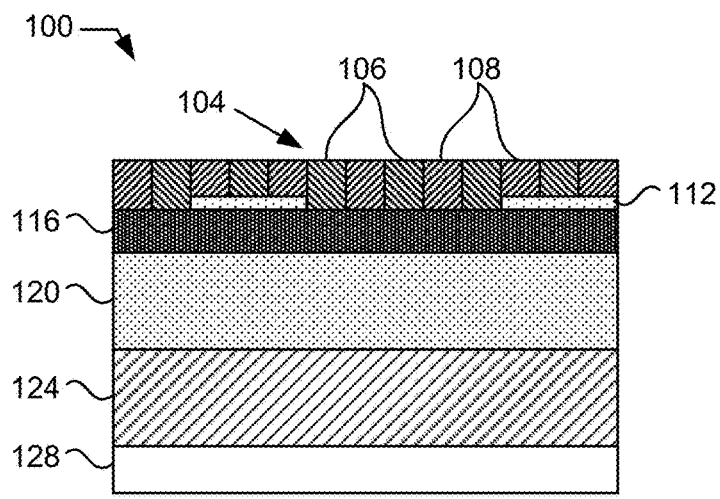
FIG. 1A depicts a schematic of a semiconductor device during one stage of DSA processing.

Methods and systems for patterning sidewall shapes are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the term "radiation sensitive material" means and includes photosensitive materials such as photoresists.

As used herein, the term "polymer block" means and includes a grouping of multiple monomer units of a single type (i.e., a homopolymer block) or multiple types (i.e., a copolymer block) of constitutional units into a continuous polymer chain of some length that forms part of a larger polymer of an even greater length and exhibits a $\chi$N value, with other polymer blocks of unlike monomer types, that is sufficient for phase separation to occur. $\chi$ is the Flory-Huggins interaction parameter and N is the total degree of polymerization for the block copolymer. According to embodiments of the present invention, the $\chi$N value of one polymer block with at least one other polymer block in the larger copolymer may be equal to or greater than about 10.5.

As used herein, the term "block copolymer" means and includes a polymer composed of chains where each chain contains two or more polymer blocks as defined above and at least two of the blocks are of sufficient segregation strength (e.g., $\chi$N>10.5) for those blocks to phase separate. A wide variety of block polymers are contemplated herein including di-block copolymers (i.e., polymers including two polymer blocks (AB)), tri-block copolymers (i.e., polymers including three polymer blocks (ABA or ABC)), multi-block copolymers (i.e., polymers including more than three polymer blocks (ABCD, etc.)), and combinations thereof.

The terms "microphase segregation" and "microphase separation," as used herein mean and include the properties by which homogeneous blocks of a block copolymer aggregate mutually, and heterogeneous blocks separate into distinct domains. In the bulk, block copolymers can self-assemble into ordered morphologies, having spherical, cylindrical, and lamellar, bicontinuous gyroid, or miktoarm star micro domains, where the molecular weight of the block copolymer dictates the sizes of the micro domains formed.

The domain size or pitch period (Lo) of the self-assembled block copolymer morphology may be used as a basis for designing critical dimensions of the patterned structure. Similarly, the structure period (Ls), which is the dimension of the feature remaining after selectively etching away one of the polymer blocks of the block copolymer, may be used as a basis for designing critical dimensions of the patterned structure. The lengths of each of the polymer blocks making up the block copolymer may be an intrinsic limit to the sizes of domains formed by the polymer blocks of those block copolymers. For example, each of the polymer blocks may be chosen with a length that facilitates self-assembly into a desired pattern of domains, and shorter and/or longer copolymers may not self-assemble as desired.

The term "annealing" or "anneal" as used herein means and includes treatment of the block copolymer so as to enable sufficient microphase segregation between the two or more different polymeric block components of the block copolymer to form an ordered pattern defined by repeating structural units formed from the polymer blocks. Annealing of the block copolymer in the present invention may be achieved by various methods known in the art, including, but not limited to: thermal annealing (either in a vacuum or in an inert atmosphere, such as nitrogen or argon), solvent vapor-assisted annealing (either at or above room temperature), supercritical fluid-assisted annealing, or absorption-based annealing (e.g., optical baking). As a specific example, thermal annealing of the block copolymer may be conducted by exposing the block copolymer to an elevated temperature that is above the glass transition temperature (Tg), but below the degradation temperature (Td) of the block copolymer, as described in greater detail hereinafter. Other conventional annealing methods not described herein may also be utilized.

The ability of block copolymers to self-organize may be used to form mask patterns. Block copolymers are formed of two or more chemically distinct blocks. For example, each block may be formed of a different monomer. The blocks are immiscible or thermodynamically incompatible, e.g., one block may be polar and the other may be non-polar. Due to thermodynamic effects, the copolymers will self-organize in solution to minimize the energy of the system as a whole; typically, this causes the copolymers to move relative to one another, e.g., so that identical blocks aggregate together, thereby forming alternating regions containing each block type or species. For example, if the copolymers are formed of polar (e.g., organometallic containing polymers) and non-polar blocks (e.g., hydrocarbon polymers), the blocks will segregate so that non-polar blocks aggregate with other non-polar blocks and polar blocks aggregate with other polar blocks. It will be appreciated that the block copolymers may be described as a self-assembling material since the blocks can move to form a pattern without active application of an external force to direct the movement of particular individual molecules, although heat may be applied to increase the rate of movement of the population of molecules as a whole.

In addition to interactions between the polymer block species, the self-assembly of block copolymers can be influenced by topographical features, such as steps or guides extending perpendicularly from the horizontal surface on which the block copolymers are deposited. For example, a di-block copolymer, a copolymer formed of two different polymer block species, may form alternating domains, or regions, which are each formed of a substantially different polymer block species. When self-assembly of polymer block species occurs in the area between the perpendicular walls of a step or guides, the steps or guides may interact with the polymer blocks such that, e.g., each of the alternating regions formed by the blocks is made to form a regularly spaced apart pattern with features oriented generally parallel to the walls and the horizontal surface.

Such self-assembly can be useful in forming masks for patterning features during semiconductor fabrication processes. For example, one of the alternating domains may be removed, thereby leaving the material forming the other region to function as a mask. The mask may be used to pattern features such as electrical devices in an underlying semiconductor substrate. Methods for forming a block copolymer mask are disclosed in U.S. Pat. No. 7,579,278; U.S. Pat. No. 7,723,009, and to U.S. Pat. No. 8,980,538, the entire disclosure of each of which is incorporated by reference herein.

In material processing methodologies, pattern etching can comprise the application of a thin layer of radiation-sensitive material, such as photo-resist, to an upper surface of a substrate, followed by patterning of the thin layer of material using lithographic techniques. In DSA patterning, the initial pattern is formed by the phase-separation of two or more phases present in a DSA layer, the selective removal of at least one phase using dry pattern etching, and the retention of at least one remaining phase, thereby providing a pattern for subsequent dry pattern etching. During dry pattern etching, a plasma etching process can be utilized, wherein plasma is formed from a process gas by coupling electromagnetic (EM) energy, such as radio frequency (RF) power, to the process gas in order to heat electrons and cause subsequent ionization and dissociation of the atomic and/or molecular constituents of the process gas. Using a series of dry etching processes, the initial pattern may be formed in the DSA layer, followed by transfer of the pattern to the underlying layers within a film stack, including the one or more material layers that are desired for the end product, e.g., electronic device. To do so, the selective removal of one material relative to other material(s) is necessary. And, among other things, during the pattern transfer process, profile control for the pattern extended into underlying layers is of critical importance.

The described embodiments include performing a Capacitive Coupled Plasma (CCP)-based curing process for selective treatment, or hardening, of PS regions in PS-b-PMMA block copolymer DSA films prior to dry etch development of PMMA regions. In various embodiments, the curing chemistry can be $Ar/H_2$, HBr, $N_2/H_2$, etc., which has the capability of generating Vacuum Ultraviolet (VUV) photon flux for polymer curing. The curing effect may enhance the etch resistance of PS regions, thereby freezing the bulk defects during plasma PMMA removal. The defects can then be measured by commonly used metrology techniques like CDSEM and quantized.

One advantage of the described methods is enhanced visibility and detection of the bulk defects, which otherwise cannot be measured. Such embodiments enable defect metrology of DSA patterning, thereby making DSA devices manufacturable, eliminating the requisite number of processing steps, and semiconductor processing, as well as reducing manufacturing time and cost. Additionally, such embodiments can be useful for quick evaluation of various BCP film materials, thereby reducing learning cycle times.

Introduction of a plasma curing step prior to removing PMMA from PS-PMMA DSA mask films may enhance etch resistance of the PS regions in the bulk of the film, thereby making bulk defects clearly visible in the form of bridging, line flops and sidewall roughness during dry plasma removal of PMMA. Without the plasma curing step prior to plasma-etch removal of PMMA from DSA films, on the other hand, the remaining PS mask margin is limited only to pattern transfer into the underlying Anti-Reflective Coating (ARC) layer. Therefore, a high selectivity process for DSA film development can be used as an alternative to a Self-Aligned Doubled Patterning (SADP) process, thereby eliminating several processing steps and making manufacturing much more cost effective for advanced technology devices. For example, such embodiments may provide additional process flexibility for patterning at sub 32 nm pitches.

Referring now to the drawings, wherein like reference numerals designate identical or corresponding parts throughout the several views, FIG. 1A depicts a schematic 100 of an input substrate 104 with a DSA pattern in a DSA patterning process. The neutral layer 112 includes a BCP comprising a first block copolymer 106 and a second copolymer 108. The first block copolymer 106 can be PMMA and a second copolymer 108 can be polystyrene. Connecting two adjacent second block copolymer 108 is a neutral layer 112. The next layers of the underlying layer include silicon anti-reflective coating (SiARC) layer 116, spin-on carbon hard mask (CHM) layer 120, an oxide layer 124, and a silicon layer 128. The technology for fabricating the DSA pattern and the layers of the underlying layer is discussed above and is known to people in the art.

Figure 1B:
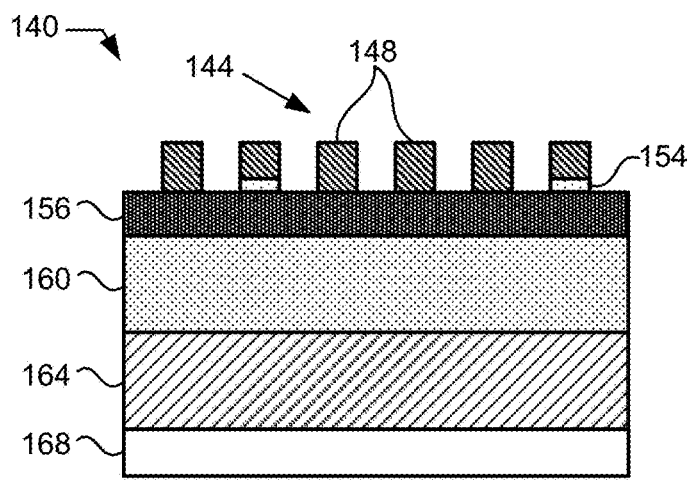
FIG. 1B depicts a schematic of a semiconductor device during one stage of DSA processing.

FIG. 1B depicts a schematic 140 of a substrate 144 after the second copolymer and portions of neutral layer are etched with the DSA patterning process, leaving the first copolymer 148 and portions of the neutral layer 154. The next layers include a SiARC layer 156, a spin-on CHM layer 160, an oxide layer 164, and a silicon layer 168.

Figure 1C:
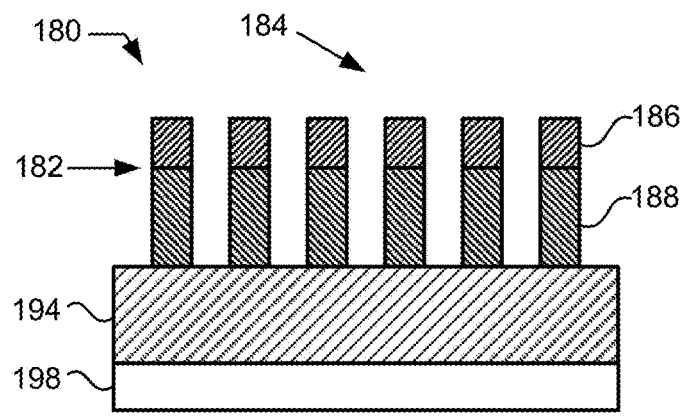
FIG. 1C depicts a schematic of a semiconductor device during one stage of DSA processing.

FIG. 1C depicts a schematic 180 of a substrate 184 after the SiARC and CHM etch process in a DSA patterning process. The structure pattern 182 comprises a SiARC portion 186 and a CHM portion 188. The next layers include an oxide layer 194 and a silicon layer 198.

Figure 2A:
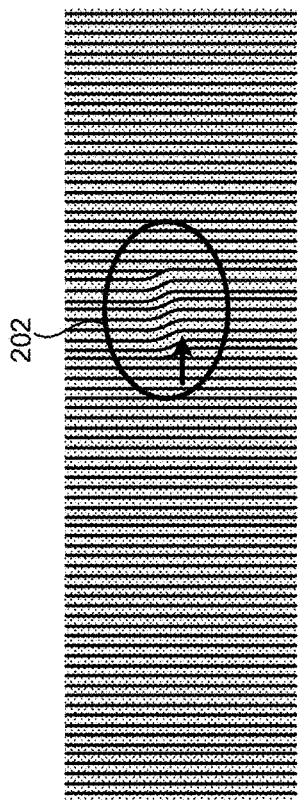
FIG. 2A depicts an embodiment of a semiconductor device manufactured by a DSA process having a dislocation pair defect.
Figure 2B:
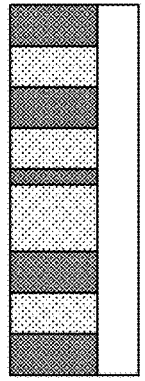
FIG. 2B is a cross-section view of an embodiment of a semiconductor device having a dislocation pair defect.
Figure 2C:
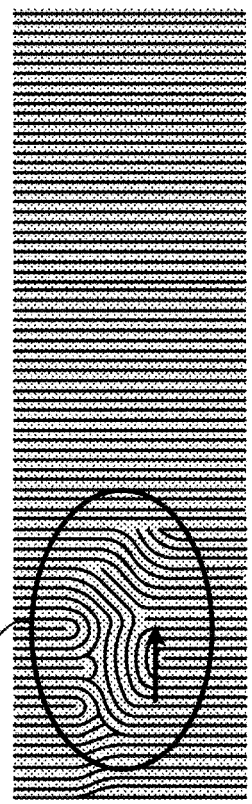
FIG. 2C depicts an embodiment of a semiconductor device manufactured by a DSA process having a disclination defect.
Figure 2D:
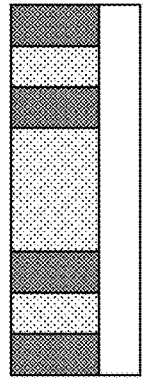
FIG. 2D is a cross-section view of an embodiment of a semiconductor device having a disclination defect.
Figure 2E:
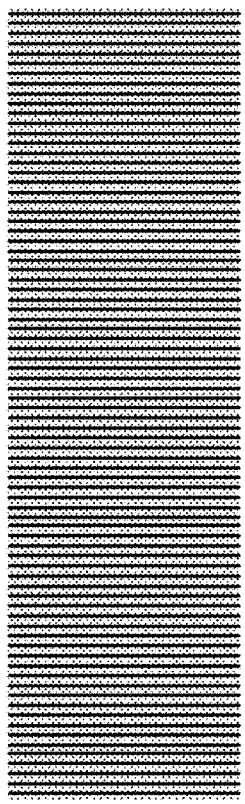
FIG. 2E depicts an embodiment of a semiconductor device manufactured by a DSA process having a buried defect.
Figure 2F:
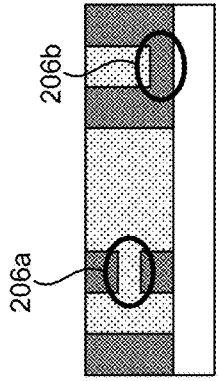
FIG. 2F is a cross-section view of an embodiment of a semiconductor device having a buried defect.

Unfortunately, semiconductor devices manufactured according to DSA processes, such as those described in FIGS. 1A-1C may include defects, such as those depicted in FIGS. 2A-2F. FIG. 2A depicts an embodiment of a semiconductor device manufactured by a DSA process having a dislocation pair defect 202. FIG. 2B illustrates a cross-section view of a dislocation pair defect 202. FIG. 2C depicts an embodiment of a semiconductor device manufactured by a DSA process having a disclination defect 204, and FIG. 2D is a cross-section view of the disclination defect 204. FIG. 2E depicts an embodiment of a semiconductor device manufactured by a DSA process having a buried defect (not visible), and FIG. 2F illustrates a cross-section view diagram illustrating a buried defect 206a, 206b.

One uncertainty relating to DSA processes includes defect density levels, and defect types for line/space process flows. The traditional topological defects such as dislocation and disclination defects shown in FIGS. 2A-2D are relatively easy to identify, because they tend to cause a ripple effect, enlarging their actual footprint, and thus making them visible to both electron and optical inspection tools. However, buried defects are still difficult to detect using traditional metrology techniques. Examples of buried defects include the formation of either PS or PMMA bridges as shown in FIG. 2F.

FIG. 3 illustrates a dry PMMA etch process that does not include a VUV cure step. In an embodiment, an incoming wafer may include layers formed thereon, the layers including a mask layer 302, which may be either a soft mask or a hard mask material. Those of ordinary skill will recognize a variety of suitable hard mask and soft mask materials. An ARC layer 304 may be formed over the mask layer 302, in some embodiments. For example, the ARC layer 304 may include a SiARC material. A neutral polymer layer 306 may also be formed in some embodiments.

In an embodiment, a top layer with a first material and a second material may be formed on the underlying layer(s). In the embodiment of FIG. 3, the top layer is a BCP layer comprising a first polymer 308 and a second polymer 310. For example, the first polymer 308 may be PS and the second polymer 310 may be PMMA. As illustrated, the first polymer 308 and the second polymer may be formed according to a DSA process in alternating regions.

During the single-step etch process, without passivation, the first polymer 308, and a portion of the second polymer 310, may be removed by a sheath of etchant radicals and ions 312. In such an embodiment, portions of the neutral polymer layer 306 may be removed as well, as illustrated in FIG. 3.

The process of FIG. 3 has several drawbacks, including low PS selectivity, which may lead to removal of nanoscale roughening and bridging defects. Consequently, there is low visibility of defects during CDSEM metrology. Because the defects are not identified, errors or non-optimal parameters in the lithography process are not discovered, and therefor go unmitigated. Additionally, the LER and LWR of the resultant semiconductor products are not as good as they could be under optimized conditions.

FIG. 4 illustrates an embodiment of a PMMA etch process, which includes a curing step for defect enhancement. The embodiment of FIG. 4 also includes an incoming wafer having a plurality of layers, including the layers 302-310 described above. In such an embodiment, the lithography process includes an additional curing step, where the top BCP layer undergoes a VUV curing process by exposure to a curing plasma sheath 402. In an embodiment, the curing process hardens the PS layer, thereby increasing PS selectivity during the etch process. In particular, the curing process may enhance etch resistance of the hardened second polymer 310 during a subsequent etch process and enable metrology to detect defects underneath a surface of the top layer. In effect, the curing process may "freeze" bulk defects in the copolymer layer(s). Such defects may include, but are not limited to, bridging between adjacent lines, line flops, and sidewall roughness as illustrated in FIGS. 2A-2F.

In an embodiment, the etch process includes removing the first polymer 308, and a portion of the hardened second polymer 404, but a reduced amount of the hardened second polymer 404 as compared with the amount of the hardened second polymer 310 removed in etch processes performed without the curing step. In such an embodiment, the metrology feedback may be used to control one or more integration variables in order to meet target integration objectives during one or more processes including the VUV curing process, the metrology process, and/or the etch process. In a further embodiment, the process may include at least partially transferring the pattern into the ARC layer 304.

The target integration objectives may include target LER, LWR, and Critical Dimension (CD). In some embodiments, the integration process may be used for rapid evaluation of BCP film material. Beneficially, improved integration processes may lower cost of ownership and increase substrate throughput, as compared with integration processes that do not use vacuum curing and metrology feedback. In various embodiments, operating variables of the integration process include plasma density, feed gas flow, etching time, process pressure, process temperature, and bias power. In a further embodiment, two or more of the operating variables of the film layer or region removal process may be controlled using a controller in order to meet target integration objectives. A suitable controller is described in further detail below with relation to the system of FIG. 8.

In such an embodiment, the LER, LWR, and CD attainable allows process flexibility at sub-32 nm pitch substrates. For example, in some embodiments, the LER may be in the range of 3.00 to 3.83 nm. Similarly, the LWR may be in the range of 4.00 to 5.00 nm. In such embodiments, the CD is in the range of 13.00 to 13.80 nm. In order to achieve such results, the etch selectivity of the first polymer 308 and the hardened second polymer 404 may be in the range of 2.0 to 2.80.

Figure 5A:
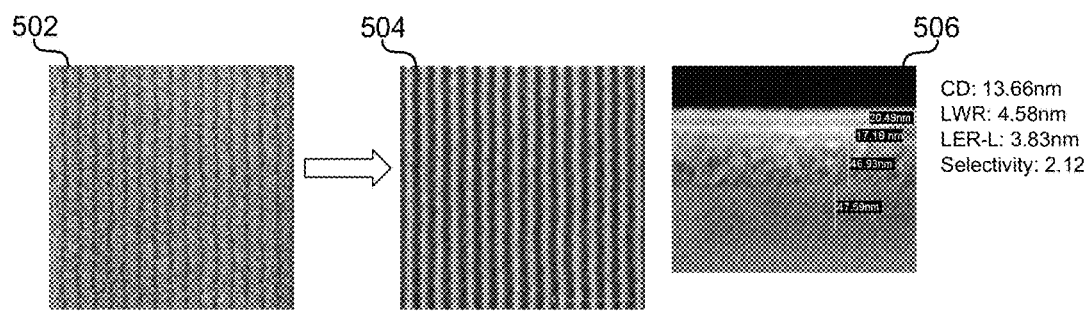
FIG. 5A illustrates a result of an embodiment of a PMMA etch process.
Figure 5B:
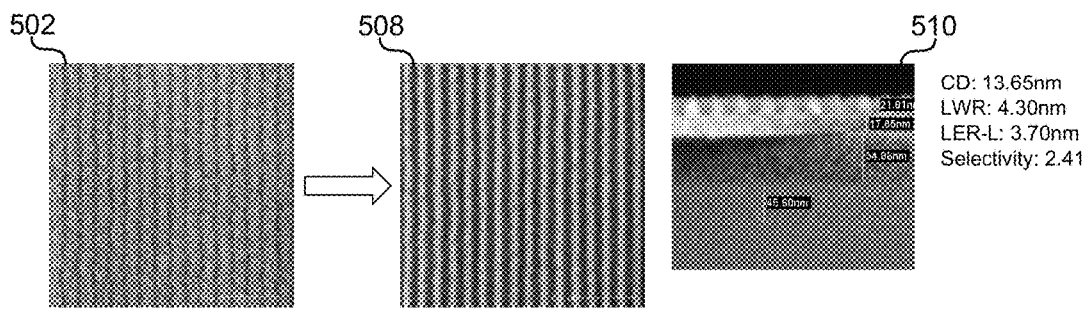
FIG. 5B illustrates a result of another embodiment of a PMMA etch process.
Figure 5C:
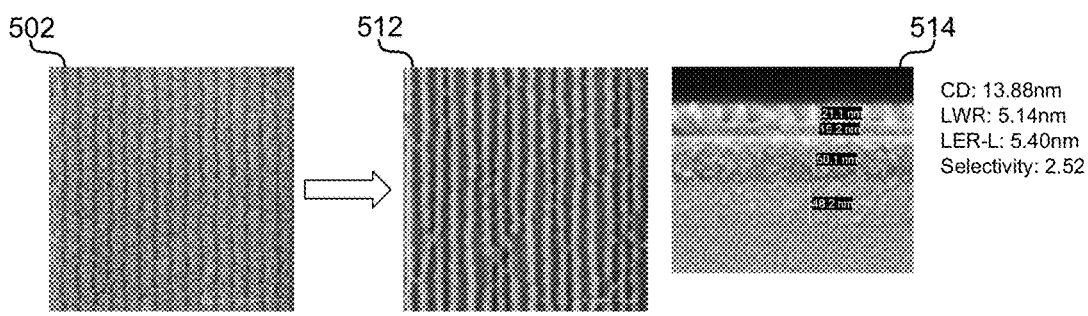
FIG. 5C illustrates a result of another embodiment of a PMMA etch process.

FIG. 5A illustrates a result of a PMMA etch process where the cure step has been omitted. FIG. 5B illustrates a result of an etch process where the VUV cure step is performed after the etch. FIG. 5C illustrates a result of an etch process where the VUV cure step is performed before the etch. The initial images 502 illustrate top views of incoming pre-etch wafers. Image 504 illustrates a top view of a post-etch wafer, where no cure step was performed. Image 506 illustrates a cross-section of the same. Image 508 illustrates a top view of the wafer after etch and a post-etch cure step, and image 510 is a cross-section of the same. Image 512 illustrates a top view of the wafer after etch and a pre-etch cure step, and image 514 is a cross-section of the same.

As shown in the images of FIGS. 5A-5B, the post-etch results of the process with no VUV cure and with the VUV cure after etch are nearly identical, and the etch process has obscured the defects, making metrology less useful. For example, the CD measurements are 13.66 nm and 13.65 for the etch without cure, and the etch with post-cure, respectively. The LWR measurements are 4.58 nm and 4.30 nm respectively, and the LER measurements are 3.83 nm and 3.70 nm respectively.

On the other hand, the process with a pre-etch VUV cure step, as shown in FIG. 5C shows more dramatic defects, where the CD is measured at 13.88 nm, the LWR is measured at 5.14 nm and the LER is measured at 5.40 nm. Inspection of the post-etch images shows that the line roughness and other subsurface defects have been preserved, and therefore are measurable for feedback in the lithography process. Such feedback may be useful for controlling the lithography parameters and mitigating the defects in subsequent processing of wafers.

Figure 6A:
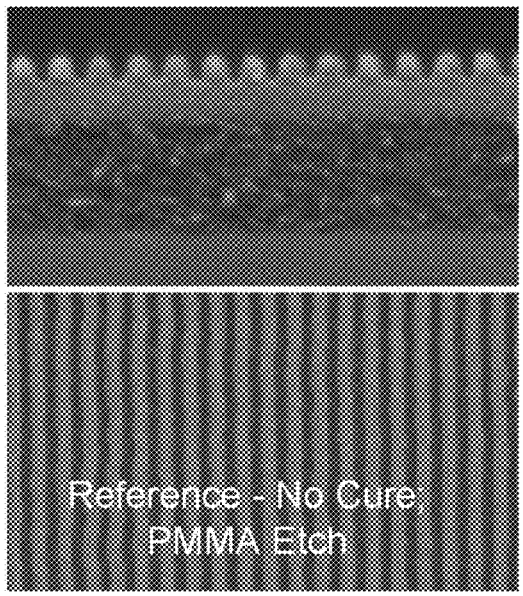
FIG. 6A illustrates a result of an embodiment of a PMMA etch process.
Figure 6B:
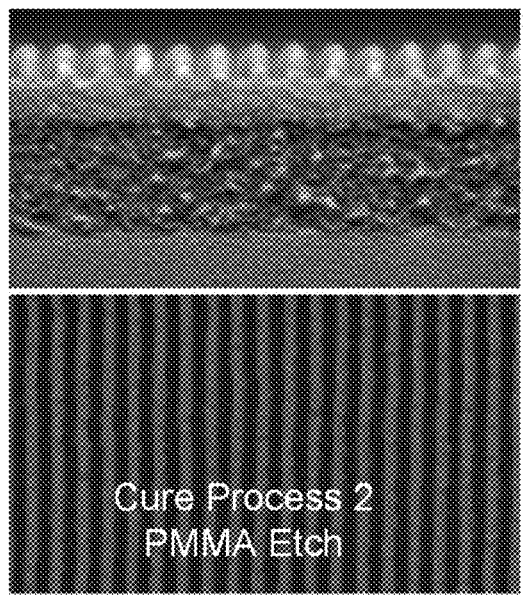
FIG. 6B illustrates a result of another embodiment of a PMMA etch process.
Figure 6C:
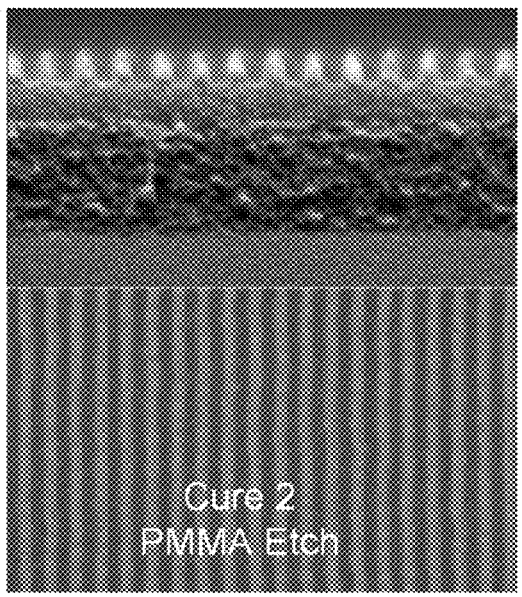
FIG. 6C illustrates a result of another embodiment of a PMMA etch process.

FIG. 6A illustrates a cross-section of a semiconductor device post-etch without the cure step. As illustrated, the selectivity is 2.06. FIG. 6B illustrates a cross-section of a device post-etch, where an Ar/H$_2$ cure step was performed before the etch. As illustrated the selectivity is 4.66, a marked increase over the etch without cure. FIG. 6C illustrates a cross-section of a device post-etch, where an HBr cure step was performed before the etch. The selectivity of this embodiment is 3.17, better than no cure, but not as strong as the Ar/H$_2$ cure. Therefore, the selectivity results can be impacted by selected cure chemistries.

Figure 6D:
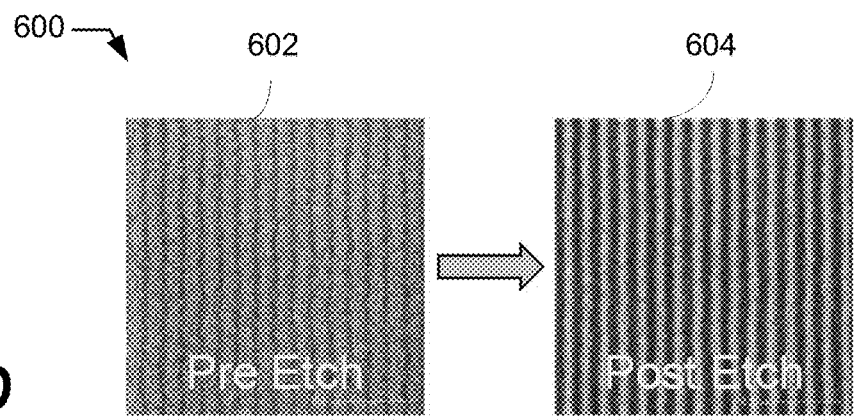
FIG. 6D illustrates a first scheme where the substrate has embedded bulk defects where no VUV cure is performed.

FIG. 6D illustrates a first scheme 600 where the substrate 602 has embedded bulk defects (not shown) where no VUV cure is performed prior to the PMMA plasma removal etch. The embedded bulk defects are partially removed due to the low selectivity to PS. The remaining embedded bulk defects manifest itself in the form of a high LWR of the post etch substrate 604.

Figure 6E:
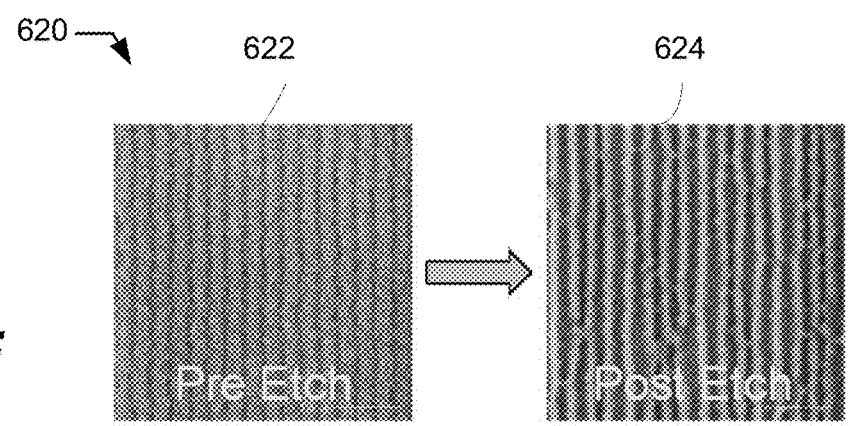
FIG. 6E illustrates a second scheme where the substrate had embedded bulk defects where a VUV cure is performed.

FIG. 6E illustrates a second scheme 620 where the substrate 622 had embedded bulk defects (not shown) where a VUV cure is performed that is followed by a PMMA plasma removal etch. The defects are highlighted in post etch substrate 624 due to the VUV cure done prior to the PMMA plasma removal etch. The highlighted defects can be utilized by the customers to tune their lithography processes so as to minimize or avoid the defects.

Figure 6F:
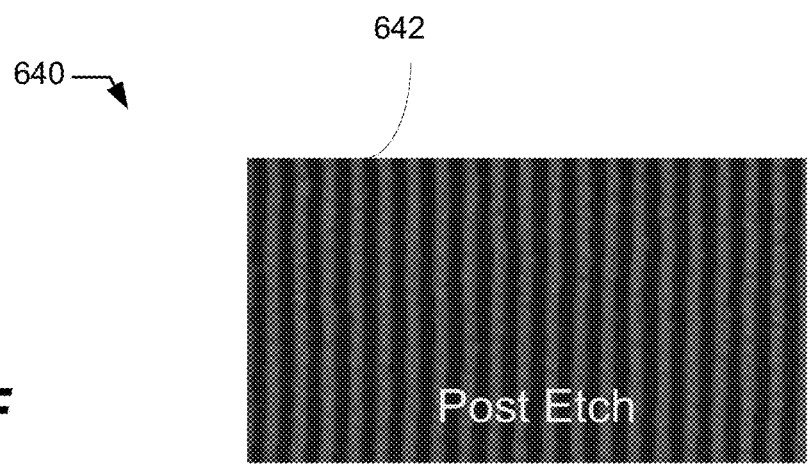
FIG. 6F illustrates a third scheme where the substrate has no embedded bulk defects and a VUV cure is performed in embodiments of a PMMA etch process.

FIG. 6F illustrates a third scheme 640 where the substrate has no embedded bulk defects and a VUV cure is performed prior to the PMMA plasma removal etch. The PMMA plasma removal etch created a post etch substrate 642 where no defects were highlighted. In summary, the second scheme 620 described in relation to FIG. 6E can be used to highlight defects embedded in the bulk material which has proven otherwise impossible to detect with current metrology means. The detected and highlighted defects are then utilized to improve and fine tune lithography processes to consistently produce the post etch substrate 642 without defects.

Figure 7:
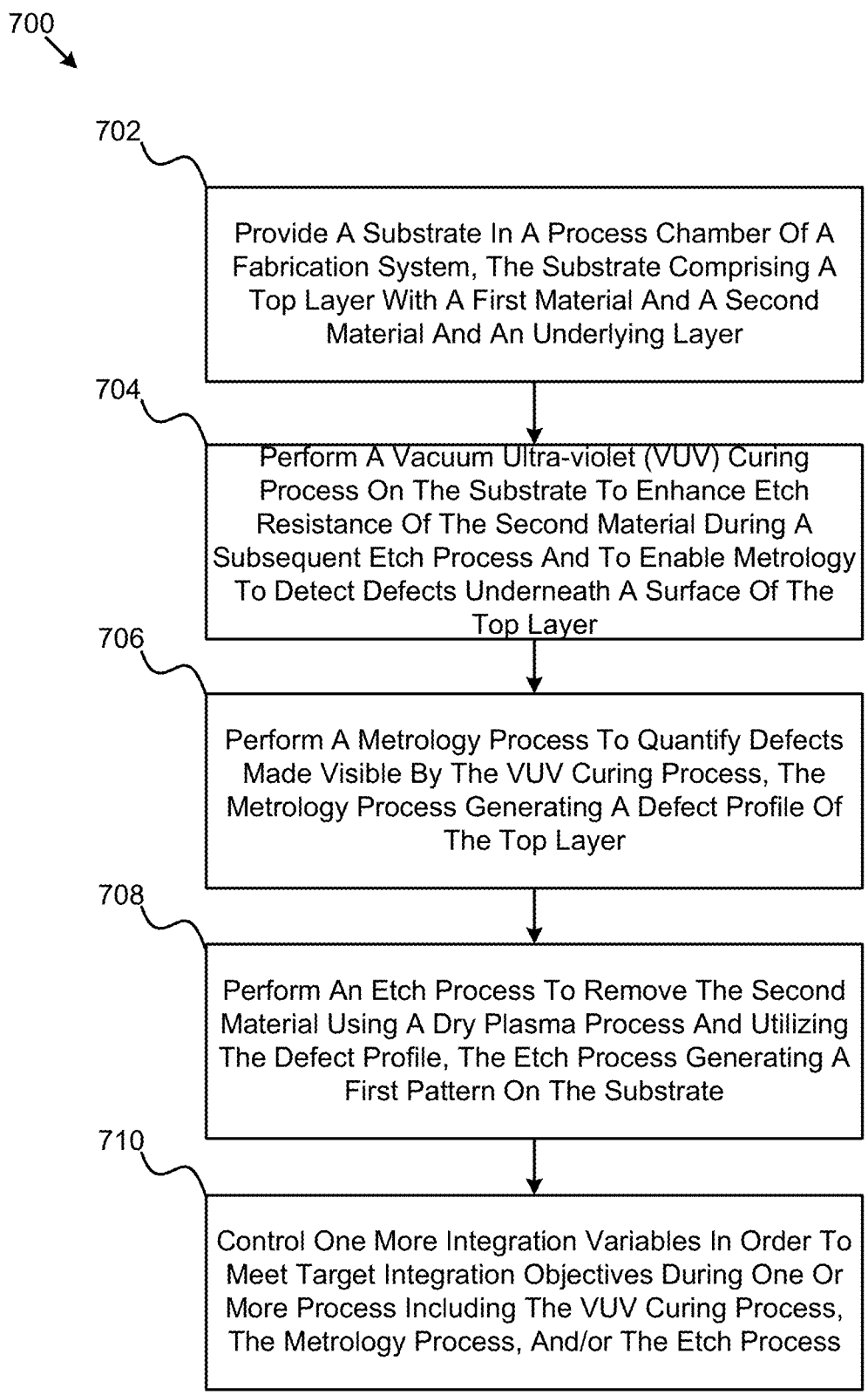
FIG. 7 illustrates an embodiment of a method for defectivity metrology during Directed Self Assembly (DSA) patterning.

FIG. 7 illustrates an embodiment of a method 700 for defectivity metrology during Directed Self Assembly (DSA) patterning. In an embodiment, the method 700 includes providing the substrate in a process chamber of the fabrication system, the substrate comprising a top layer with a first material and a second material and an underlying layer as shown at block 702. The method 700 may also include performing a vacuum ultra-violet (VUV) curing process on the substrate to enhance etch resistance of the second material during a subsequent etch process and to enable metrology to detect defects underneath a surface of the top layer at block 704. Block 706 describes the step of performing a metrology process to quantify defects made visible by the VUV curing process, the metrology process generating a defect profile of the top layer. In an embodiment, the method 700 may also include performing an etch process to remove the second material using a dry plasma process and utilizing the defect profile, the etch process generating a first pattern on the substrate, as shown at block 708. At block 710, the method 700 includes controlling one more integration variables in order to meet target integration objectives during one or more process including the VUV curing process, the metrology process, and/or the etch process.

Figure 8:
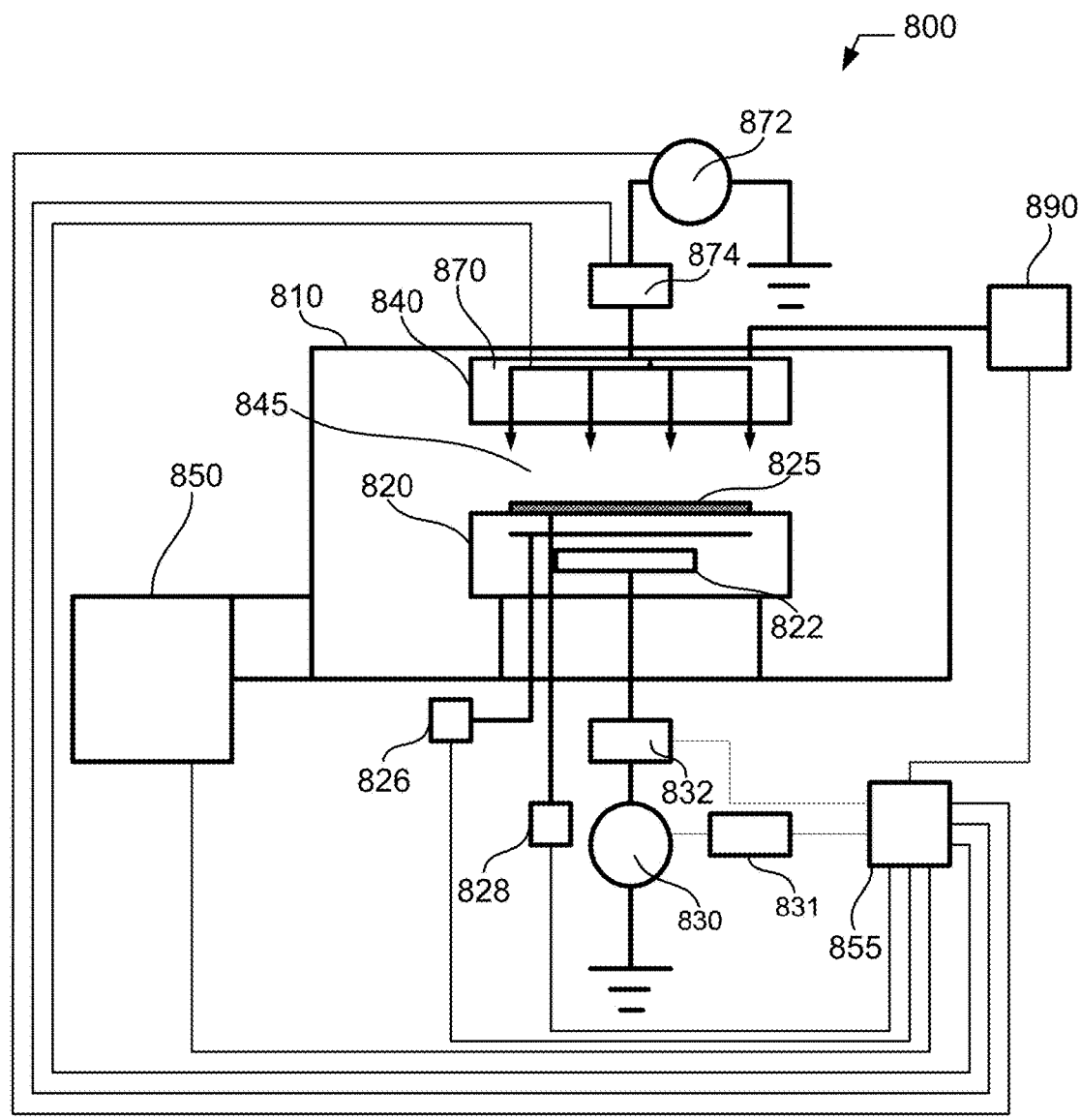
FIG. 8 is a schematic block diagram of one embodiment of a semiconductor etch system.

FIG. 8 is an embodiment of a system 800 for performing an etch and post heat treatment. In a further embodiment, as described with reference to FIG. 4, the system 800 may be further configured for curing and etching BCP layers. An etch and post heat treatment system 800 configured to perform the above identified process conditions is depicted in FIG. 8 comprising a processing chamber 810, substrate holder 820, upon which a substrate 825 to be processed is affixed, and vacuum pumping system 850. Substrate 825 can be a semiconductor substrate, a wafer, a flat panel display, or a liquid crystal display. Processing chamber 810 can be configured to facilitate etching the processing region 845 in the vicinity of a surface of substrate 825. An ionizable gas or mixture of process gases is introduced via a gas distribution system 840. For a given flow of process gas, the process pressure is adjusted using the vacuum pumping system 850.

The cure plasma may include chemistries such as $Ar/H_2$, HBr, $N_2/H_2$, etc., which has the capability of generating VUV photon flux for polymer curing. The curing effect may enhance the etch resistance of PS regions, thereby freezing the bulk defects during plasma PMMA removal. In such an embodiment, defect visibility with CDSEM is improved. Accordingly, the metrology process may quantify the defects made visible by the VUV curing process and generate a defect profile of the top layer. Consequently, feedback may be obtained for optimization of lithography processes, and for mitigation of further defects.

Substrate 825 can be affixed to the substrate holder 820 via a clamping system (not shown), such as a mechanical clamping system or an electrical clamping system (e.g., an electrostatic clamping system). Furthermore, substrate holder 820 can include a heating system (not shown) or a cooling system (not shown) that is configured to adjust and/or control the temperature of substrate holder 820 and substrate 825. The heating system or cooling system may comprise a re-circulating flow of heat transfer fluid that receives heat from substrate holder 820 and transfers heat to a heat exchanger system (not shown) when cooling, or transfers heat from the heat exchanger system to substrate holder 820 when heating. In other embodiments, heating/cooling elements, such as resistive heating elements, or thermo-electric heaters/coolers can be included in the substrate holder 820, as well as the chamber wall of the processing chamber 810 and any other component within the processing system 800.

Additionally, a heat transfer gas can be delivered to the backside of substrate 825 via a backside gas supply system 826 in order to improve the gas-gap thermal conductance between substrate 825 and substrate holder 820. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 825.

In the embodiment shown in FIG. 8, plasma processing system 800 can further comprise a direct current (DC) power supply 890 coupled to the upper electrode 870 opposing substrate 825. The upper electrode 870 may comprise an electrode plate. The electrode plate may comprise a silicon-containing electrode plate. Moreover, the electrode plate may comprise a doped silicon electrode plate. The DC power supply 890 can include a variable DC power supply. Additionally, the DC power supply 890 can include a bipolar DC power supply. The DC power supply 890 can further include a system configured to perform at least one of monitoring, adjusting, or controlling the polarity, current, voltage, or on/off state of the DC power supply 890. Once plasma is formed, the DC power supply 890 facilitates the formation of a ballistic electron beam. An electrical filter (not shown) may be utilized to de-couple RF power from the DC power supply 890.

In the embodiment shown in FIG. 8, substrate holder 820 can comprise an electrode 822 through which RF power is coupled to the processing region 845. For example, substrate holder 820 can be electrically biased at a RF voltage via the transmission of RF power from a RF generator 830 through an optional impedance match network 832 to substrate holder 820. The RF electrical bias can serve to heat electrons to form and maintain plasma. In this configuration, the system 800 can operate as a reactive ion etch (RIE) reactor, wherein the chamber and an upper gas injection electrode serve as ground surfaces.

Furthermore, the electrical bias of electrode 822 at a RF voltage may be pulsed using pulsed bias signal controller 831. The RF power output from the RF generator 830 may be pulsed between an off-state and an on-state, for example. Alternately, RF power is applied to the substrate holder electrode at multiple frequencies. Furthermore, impedance match network 832 can improve the transfer of RF power to plasma in plasma processing chamber 810 by reducing the reflected power. Match network topologies (e.g. L-type, π-type, T-type, etc.) and automatic control methods are well known to those skilled in the art.

Gas distribution system 840 may comprise a showerhead design for introducing a mixture of process gases. Alternatively, gas distribution system 840 may comprise a multi-zone showerhead design for introducing a mixture of process gases, and adjusting the distribution of the mixture of process gases above substrate 825. For example, the multi-zone showerhead design may be configured to adjust the process gas flow or composition to a substantially peripheral region above substrate 825 relative to the amount of process gas flow or composition to a substantially central region above substrate 825. In such an embodiment, gases may be dispensed in a suitable combination to form a VUV cure plasma and/or dry etch plasma within the chamber 810.

Vacuum pumping system 850 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 810.

In an embodiment, the controller 855 can comprise a microprocessor, memory, and a digital I/O port capable of generating control voltages sufficient to communicate and activate inputs to processing system 800 as well as monitor outputs from plasma processing system 800. Moreover, controller 855 can be coupled to and can exchange information with RF generator 830, pulsed bias signal controller 831, impedance match network 832, the gas distribution system 840, vacuum pumping system 850, as well as the substrate heating/cooling system (not shown), the backside gas supply system 826, and/or the electrostatic clamping system 828. For example, a program stored in the memory can be utilized to activate the inputs to the aforementioned components of processing system 800 according to a process recipe in order to perform a plasma assisted process, such as a plasma etch process or a post heating treatment process, on substrate 825.

In addition, the processing system 800 can further comprise an upper electrode 870 to which RF power can be coupled from RF generator 872 through optional impedance match network 874. A frequency for the application of RF power to the upper electrode can range from about 0.1 MHz to about 200 MHz, in one embodiment. Alternatively, the present embodiments may be used in connection with Inductively Coupled Plasma (ICP) sources, Capacitive Coupled Plasma (CCP) sources, Radial Line Slot Antenna (RLSA) sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 80 MHz. Moreover, controller 855 is coupled to RF generator 872 and impedance match network 874 in order to control the application of RF power to upper electrode 870. The design and implementation of an upper electrode is well known to those skilled in the art. The upper electrode 870 and the gas distribution system 840 can be designed within the same chamber assembly, as shown. Alternatively, upper electrode 870 may comprise a multi-zone electrode design for adjusting the RF power distribution coupled to plasma above substrate 825. For example, the upper electrode 870 may be segmented into a center electrode and an edge electrode.

Depending on the applications, additional devices such as sensors or metrology devices can be coupled to the processing chamber 810 and to the controller 855 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pulldown of structures (pulldown), slimming of structures (slimming), aspect ratio of structures (aspect ratio), line width roughness, substrate throughput, cost of ownership, and the like are achieved.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method for an integration process for enabling defectivity metrology on a substrate, the method comprising:
providing the substrate in a process chamber of a fabrication system, the substrate comprising a top layer with a first material and a second material and an underlying layer;
performing a vacuum ultra-violet (VUV) curing process on the substrate to enhance etch resistance of the second material during a subsequent etch process and to enable metrology to detect defects underneath a surface of the top layer;
performing a metrology process to quantify defects made visible by the VUV curing process, the metrology process generating a defect profile of the top layer;
performing an etch process to remove the second material using a dry plasma process and utilizing the defect profile, the etch process generating a first pattern on the substrate; and
controlling one or more integration variables in order to meet target integration objectives during one or more processes including the VUV curing process, the metrology process, and/or the etch process.

2. The method of claim 1 wherein the target integration objectives comprise a target line edge roughness (LER), a line width roughness (LWR), and a target critical dimension (CD).

3. The method of claim 2 wherein the top layer is a copolymer layer and the first material and the second material are copolymers.

4. The method of claim 3 wherein the first copolymer is polystyrene (PS) and the second copolymer is polymethylmethacrylate (PMMA).

5. The method of claim 4 wherein the underlying layer comprises a neutral polymer layer; an anti-reflective coating (ARC) layer; and a combined soft and hard mask layer.

6. The method of claim 5 wherein a curing chemistry used in the VUV curing process comprises $Ar/H_2$, HBr, or $N_2/H_2$.

7. The method of claim 5 further comprising transferring the first pattern into the ARC layer.

8. The method of claim 3 wherein the metrology process allows visibility of bulk defects in the copolymer layer.

9. The method of claim 8 wherein the LER, LWR, and CD attainable allows process flexibility at sub-32 nm pitch substrates.

10. The method of claim 9 wherein the LER is in a range of 3.00 to nm 3.83 nm.

11. The method of claim 9 wherein the LWR is in the range of 4.00 to 5.00 nm.

12. The method of claim 9 wherein the CD is in the range from 13.00 to 13.80 nm.

13. The method of claim 9 wherein an etch selectivity of the first copolymer to the second copolymer is 2.0 to 2.80.

14. The method of claim 1 wherein the metrology process is performed with a critical dimension scanning electron microscope (CDSEM).

15. The method of claim 1 wherein the integration process is used for rapid evaluation of block copolymer (BCP) film material.

16. The method of claim 1 wherein the integration process lowers cost of ownership and increases substrate throughput over integration processes not using vacuum curing and metrology processes.

17. The method of claim 1 wherein the top layer is a copolymer layer and the integration process enables freezing of bulk defects in the copolymer layer.

18. The method of claim 17 wherein the bulk defects include bridging between adjacent lines, line flops, and sidewall roughness.

19. The method of claim 1 wherein the one or more integration variables include at least one of a plasma density, a feed gas flow, an etching time, a process pressure, a process temperature, or a bias power.

20. The method of claim 19 wherein two or more of the integration variables are controlled using a controller in order to meet the target integration objectives.

\* \* \* \* \*

UNITED STATES PATENT AND TRADEMARK OFFICE
CERTIFICATE OF CORRECTION

| | | |
|---|---|---|
| PATENT NO. | : 9,947,597 B2 | Page 1 of 1 |
| APPLICATION NO. | : 15/462005 | |
| DATED | : April 17, 2018 | |
| INVENTOR(S) | : Vinayak Rastogi et al. | |

It is certified that error appears in the above-identified patent and that said Letters Patent is hereby corrected as shown below:

In the Drawings

Fig. 7., Box #710, "Control One More Integration Variables", should read --Control One or More Integration Variables--.

In the Specification

In Column 6, Line 47, "and to U.S. Pat. No. 8,980,538,", should read --and U.S. Pat. No. 8,980,538,--.

In Column 7, Line 53, "adjacent second block copolymer 108", should read --adjacent second block copolymers 108--.

In Column 8, Lines 58-59, "and therfor go unmitigated.", should read --and therefore go unmitigated.--.

In Column 10, Lines 29-30, "embedded bulk defects manifest itself in the form of", should read --embedded bulk defects manifest in the form of--.

In Column 10, Line 46, "bulk material which has proven", should read --bulk material that have proven--.

In Column 11, Lines 4-5, "the method 700 includes controlling one more integration variables", should read --the method 700 includes controlling one or more integration variables--.

In the Claims

In Column 14, Lines 37-38, "in a range of 3.00 to nm 3.83nm.", should read --in a range of 3.00 to 3.83 nm.--.

Signed and Sealed this
Third Day of July, 2018

Andrei Iancu
*Director of the United States Patent and Trademark Office*